US012701935B2

(12) United States Patent
Deijkers et al.

(10) Patent No.: US 12,701,935 B2
(45) Date of Patent: Aug. 4, 2026

(54) METHOD OF DEPOSITING MATERIAL AND SEMICONDUCTOR DEVICES

(71) Applicant: ASM IP Holding B.V., Almere (NL)

(72) Inventors: Johanna Henrica Deijkers, Eindhoven (NL); Adriaan Jacobus Martinus Mackus, Eindhoven (NL); Ageeth Anke Bol, Nuenen (NL); Wilhelmus M. M. Kessels, Tilburg (NL); Hessel Sprey, Leuven (BE); Jan Willem Maes, Wilrijk (BE)

(73) Assignee: ASM IP Holding B.V., Almere (NL)

( * ) Notice: Subject to any disclaimer, the term of this patent is extended or adjusted under 35 U.S.C. 154(b) by 482 days.

(21) Appl. No.: 17/824,774

(22) Filed: May 25, 2022

(65) Prior Publication Data

US 2022/0384197 A1     Dec. 1, 2022

Related U.S. Application Data

(60) Provisional application No. 63/194,278, filed on May 28, 2021.

(51) Int. Cl.
    *H01L 21/285*       (2006.01)
    *C23C 16/30*        (2006.01)
          (Continued)

(52) U.S. Cl.
    CPC .......... *H10P 14/418* (2026.01); *C23C 16/305* (2013.01); *C23C 16/45536* (2013.01); *H10W 20/033* (2026.01); *H10W 20/425* (2026.01)

(58) Field of Classification Search
    CPC ......... H01L 21/28568; H01L 21/76843; H01L 23/53238; H01L 21/28556;
          (Continued)

(56) References Cited

U.S. PATENT DOCUMENTS

| | | | |
|---|---|---|---|
| 9,353,139 B2 * | 5/2016 | Sundermeyer ............ | C07F 7/10 |
| 9,461,134 B1 * | 10/2016 | Xie ........................ | H01L 23/291 |

(Continued)

FOREIGN PATENT DOCUMENTS

| | | | | |
|---|---|---|---|---|
| GB | 2548628 A | * | 9/2017 | ......... C23C 16/4481 |
| WO | 2015117150 A1 | | 8/2015 | |
| WO | 2018004587 A1 | | 1/2018 | |

OTHER PUBLICATIONS

Lo, Chun-Li et al. "BEOL Compatible Sub-nm Diffusion Barrier for Advanced Cu Interconnects"; 2018.

(Continued)

*Primary Examiner* — Steven B Gauthier
*Assistant Examiner* — Alvin L Lee
(74) *Attorney, Agent, or Firm* — Snell & Wilmer L.L.P.

(57) ABSTRACT

The current disclosure relates to deposition of a transition metal chalcogenide barrier layer. The method of depositing a transition metal chalcogenide barrier layer comprises providing a substrate having an opening into a reaction chamber, providing a transition metal precursor in the reaction chamber in vapor phase and providing an reactive chalcogen species in the reaction chamber. The method may be a plasma-enhanced atomic layer deposition method. The disclosure further relates to an interconnect comprising a transition metal chalcogenide barrier layer.

17 Claims, 3 Drawing Sheets

(51) Int. Cl.

| | |
|---|---|
| *C23C 16/455* | (2006.01) |
| *H01L 21/768* | (2006.01) |
| *H01L 23/532* | (2006.01) |
| *H10P 14/40* | (2026.01) |
| *H10W 20/00* | (2026.01) |
| *H10W 20/41* | (2026.01) |

(58) Field of Classification Search

CPC ......... H01L 21/28562; H01L 21/76829; H01L 21/76846; C23C 16/305; C23C 16/45536; C23C 16/045; C23C 16/45523; C23C 16/4554; C23C 16/50; C23C 16/45525; C23C 16/4401; C23C 16/505; C23C 16/511; C23C 16/45553

See application file for complete search history.

(56) References Cited

U.S. PATENT DOCUMENTS

| | | | |
|---|---|---|---|
| 10,163,644 B2 | 12/2018 | Lin | |
| 10,170,322 B1 | 1/2019 | Cheng | |
| 10,847,366 B2 | 11/2020 | Mattinen et al. | |
| 11,043,454 B2 | 6/2021 | Hedge et al. | |
| 11,047,042 B2 | 6/2021 | McKee et al. | |
| 11,756,828 B2 | 9/2023 | Wong et al. | |
| 2013/0267082 A1* | 10/2013 | Gatineau | C23C 16/18 |
| | | | 438/508 |
| 2016/0233322 A1 | 8/2016 | Yeh et al. | |
| 2016/0372351 A1 | 12/2016 | Singh et al. | |
| 2018/0108587 A1* | 4/2018 | Jiang | H01L 21/306 |
| 2019/0006586 A1* | 1/2019 | Maes | C23C 16/305 |
| 2020/0312775 A1 | 10/2020 | Lee et al. | |
| 2021/0032749 A1* | 2/2021 | Trinh | C23C 16/45551 |
| 2021/0066080 A1 | 3/2021 | Mattinen et al. | |
| 2022/0139775 A1* | 5/2022 | Naylor | H10W 20/033 |
| | | | 438/625 |
| 2022/0238324 A1* | 7/2022 | Good | C23C 16/50 |

OTHER PUBLICATIONS

Sharma, Akhil et al. "Low-temperature plasma-enhanced atomic layer deposition of 2-D MoS2: large area, thickness control and tuneable morphology"; Nanoscale; The Royal Society of Chemistry; Apr. 2018.

* cited by examiner

100

110

120          130

200

Provide substrate into reaction chamber — 201

Provide transition metal precursor in reaction chamber — 202

Purge — 203

205

Provide reactive chalcogen species in reaction chamber — 204

Purge — 203

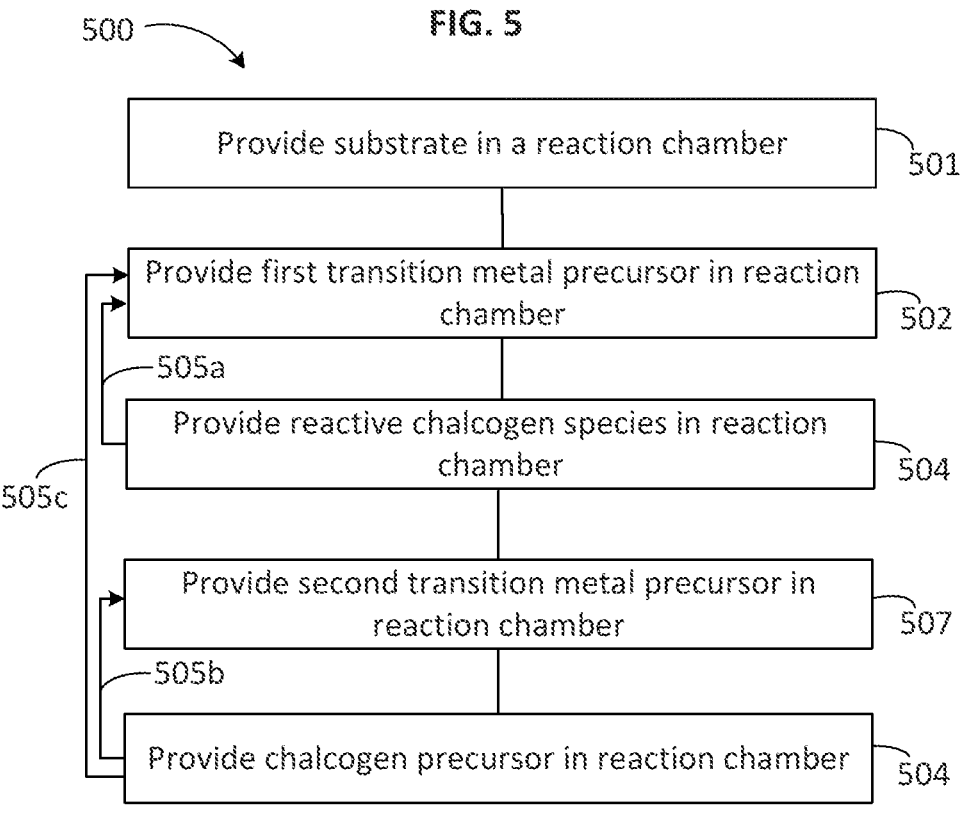

Provide substrate in a reaction chamber — 501

Provide first transition metal precursor in reaction chamber — 502

505a

Provide reactive chalcogen species in reaction chamber — 504

505c

Provide second transition metal precursor in reaction chamber — 507

505b

Provide chalcogen precursor in reaction chamber — 504

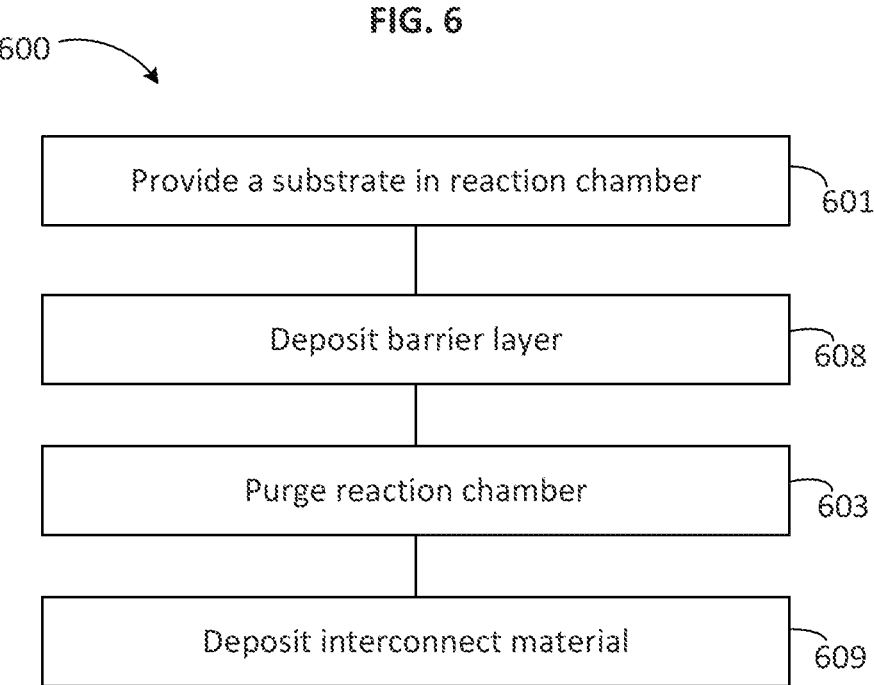

Provide a substrate in reaction chamber — 601

Deposit barrier layer — 608

Purge reaction chamber — 603

Deposit interconnect material — 609

METHOD OF DEPOSITING MATERIAL AND SEMICONDUCTOR DEVICES

CROSS-REFERENCE TO RELATED APPLICATIONS

This application claims priority to U.S. Provisional Patent Application Ser. No. 63/194,278 filed May 28, 2021 titled METHOD OF DEPOSITING MATERIAL AND SEMICONDUCTOR DEVICES, the disclosure of which is hereby incorporated by reference in its entirety.

FIELD

The present disclosure relates to methods of depositing barrier layers, semiconductor devices comprising barrier layers and apparatuses for the manufacture of semiconductor devices. More particularly, the disclosure relates to methods and systems for depositing very thin transition metal chalcogenide layers on a semiconductor substrate.

BACKGROUND

Current interconnect technology involves, for example, the deposition of thin TaN barrier layer using physical vapor deposition (PVD) to prevent the diffusion of Cu in the interlayer dielectric (ILD). A TaN layer of a few nanometers thick is needed in order to have an effective barrier. However, the thickness of this layer limits the space left for filling the via/trench with Cu. Especially when scaling the interconnects to smaller dimensions, the thickness of the barrier layer is becoming the limiting factor, leading to an unacceptable increase of the resistance.

Novel materials, including 2D materials, i.e. continuous layers of a few molecular layers, are being explored as a solution to the problems caused by decreasing interconnect dimensions. However, producing uniform layers under conditions compatible with back-end of line (BEOL) processing has proven to be very challenging.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a transition metal chalcogenide barrier layer. The embodiments of the current disclosure further relate to interconnect structures comprising a transition metal chalcogenide barrier layer.

In an aspect, a method of depositing a transition metal chalcogenide barrier layer according to the current disclosure comprises providing a substrate having an opening into a reaction chamber, providing a transition metal precursor in the reaction chamber in vapor phase and providing an reactive chalcogen species in the reaction chamber.

In another aspect, the current disclosure relates to a method of depositing a transition metal chalcogenide barrier layer, and the method comprises providing a substrate having an opening into a reaction chamber, providing a transition metal precursor in the reaction chamber in vapor phase, providing an oxygen precursor in the reaction chamber; and providing an reactive chalcogen species in the reaction chamber.

In a third aspect, an interconnect structure is disclosed. The interconnect structure comprises conductive interconnect material comprising an outer surface, dielectric material facing the outer surface of interconnect material and a barrier layer disposed between the surface and the dielectric material, wherein the barrier layer comprises essentially of a transition metal chalcogenide deposited using a metal organic transition metal precursor and an reactive chalcogen species, and wherein the barrier layer has a thickness of 3 nm or less.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings.

FIG. 5 depicts another exemplary embodiment of a method according to the current disclosure in which two different transition metal precursors are used.

FIG. 6 depicts a further exemplary embodiment of a method according to the current disclosure.

DETAILED DESCRIPTION

Figure 1:
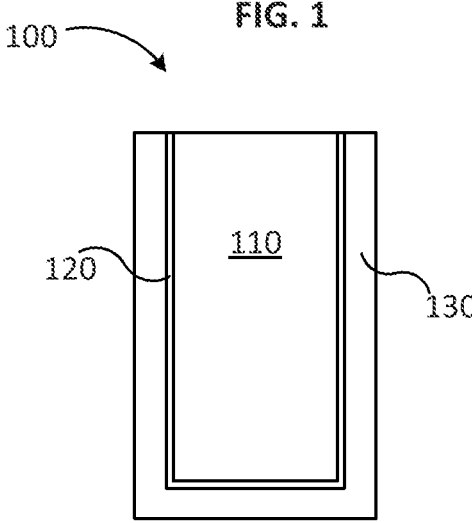
FIG. 1 illustrates an exemplary embodiment of an interconnect containing a barrier layer according to the current disclosure.

The description of exemplary embodiments of methods and structures provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In an aspect, a method of depositing a transition metal chalcogenide barrier layer is disclosed, the method comprising providing a substrate having an opening into a reaction chamber, providing a transition metal precursor in the reaction chamber in vapor phase, and providing an reactive chalcogen species in the reaction chamber. In some embodiments, the opening is a contact opening.

Barrier Layer

A barrier layer may be used to separate a metal line from the surrounding dielectric material, such as silicon oxide. In some embodiments, the surrounding material is semiconducting material. For example, the metal line may be made of copper. Metal diffusion into the dielectric material may result in conductive paths which can cause short-circuiting. However, the material on which a barrier layer is deposited, does not need to be dielectric or semiconductor material. In some embodiments, a barrier layer may be used between two metal or metallic materials. In some embodiments, a barrier layer is used to separate a dielectric material from surrounding metal or metallic material.

Thus, barrier layers may help to maintain the functionality of a semiconductor device. For example, in case of metal lines, the narrower the line, the thinner the barrier layer can be in order for the line to achieve the targeted properties. Current barrier layer materials, such as TaN/Ta are not effective in preventing the diffusion of metal into the dielectric at thicknesses that are required in future semiconductor devices. However, transition metal chalcogenides (TMC's) may be effective barrier layer materials also as very thin layers, such as under 3 nm, or under 2 nm, or under 1 nm. Conventional TMC deposition methods may not produce a uniform enough layer at a low enough temperature to offer viable solutions to provide barrier materials.

A barrier layer as used herein is a functional structure, and it can be formed of one layer or a combination of two or more layers. The barrier layer may be composed of a single TMC. A barrier layer according to the current disclosure is a substantially or completely continuous layer. In some embodiments, the barrier layer thickness may be only one or a few molecular layers. In some embodiments, the barrier layer may be crystalline material. Crystalline layers having a thickness of a few molecular layers may be termed two-dimensional layers. In some embodiments, the barrier layer is amorphous after deposition. In some embodiments, the barrier layer is crystalline after deposition. In some embodiments, a barrier layer according to the current disclosure may comprise, consist essentially of, or consist of amorphous material. In some embodiments, an amorphous material forms a substantially closed or a completely closer layer. In some embodiments, the barrier layer is substantially continuous and has a thickness of 3 nm or less. In some embodiments, the thickness of a barrier layer may be from about 0.5 nm to about 3 nm. In some embodiments, the thickness of a barrier layer may be from about 1 nm to about 3 nm. In some embodiments, the thickness of a barrier layer may be from about 2 nm to about 3 nm. In some embodiments, the thickness of a barrier layer may be from about 0.5 nm to about 1 nm. In some embodiments, the thickness of a barrier layer may be from about 0.5 nm to about 1.5 nm. In some embodiments, the thickness of a barrier layer may be from about 0.5 nm to about 2 nm.

For example, a molybdenum disulfide layer according to the current disclosure may have a thickness of about 0.6 nm, or a thickness of about 0.8 nm. In some embodiments, a single monolayer may have a thickness of about 0.7 nm.

Transition metal chalcogenides may exist in various phases. Unless otherwise indicated, the transition metal chalcogenides are referred to in a general form without specifying a general phase. In some embodiments, a transition metal chalcogenide is a transition metal dichalcogenide. In some embodiments, a transition metal chalcogenide is a transition metal trichalcogenide. In some embodiments, TMC is molybdenum disulfide ($MoS_2$). In some embodiments, TMC is molybdenum trisulfide ($MoS_3$). In some embodiments, TMC is molybdenum diselenide ($MoSe_2$). In some embodiments, TMC is molybdenum ditelluride ($MoTe_2$). In some embodiments, the TMC is tungsten disulfide ($WS_2$). In some embodiments, the TMC is tungsten diselenide ($WSe_2$). In some embodiments, the TMC is tungsten ditelluide ($WTe_2$). In some embodiments, the transition metal chalcogenide is tantalum disulfide ($TaS_2$). In some embodiments, the transition metal chalcogenide is niobium disulfide ($NbS_2$). In some embodiments, the transition metal chalcogenide is niobium trisulfide ($NbS_3$). In some embodiments, the transition metal chalcogenide is niobium triselenide ($NbSe_3$). In some embodiments, the transition metal chalcogenide is titanium disulfide ($TiS_2$). In some embodiments, the transition metal chalcogenide is titanium trisulfide ($TiS_3$). In some embodiments, the transition metal chalcogenide is titanium diselenide ($TiSe_2$). In some embodiments, the transition metal chalcogenide is titanium tritelluride ($TiTe_3$). In some embodiments, the transition metal chalcogenide is rhenium disulfide ($ReS_2$). In some embodiments, the transition metal chalcogenide is zirconium tritelluride ($ZrTe_3$). In some embodiments, the transition metal chalcogenide is hafnium tritelluride ($HfTe_3$). In some embodiments, the barrier layer consists essentially of, or consists of a transition metal chalcogenide. In some embodiments, the barrier layer consists essentially of or consists of one transition metal chalcogenide. In some embodiments, the barrier layer consists essentially of or consists of two transition metal chalcogenides.

Thus, in some embodiments, the transition metal chalcogenide according to the current disclosure is a transition metal sulfide. In some embodiments, the transition metal chalcogenide according to the current disclosure is a transition metal telluride. In some embodiments, the transition metal chalcogenide according to the current disclosure is a transition metal selenide. In some embodiments, TMC is molybdenum telluride, In some embodiments.

In some embodiments, a barrier layer deposited according to the current disclosure may comprise, for example, from about 60 to about 99.5 at. % TMC, or from about 80 to about 99.5 at. % TMC, or from about 90 to about 99.5 at. % TMC, or from about 95 to about 99.5 at. % TMC. A transition metal-comprising material deposited by a method according to the current disclosure may comprise, for example about 80 at. %, about 83 at. %, about 85 at. %, about 87 at. %, about 90 at. %, about 95 at. %, about 97 at. % or about 99 at. % or about 100 at. % TMC. The specifics of a deposition process determine how large a portion of a transition metal and of the chalcogen are in chalcogenide form. In some embodiments, either component of a TMC, i.e. metal and chalcogen, may be present in excess relative to the other component in a barrier layer according to the current disclosure. In some embodiments, the majority of a barrier layer according to the current disclosure exists as a chalcogenide in a barrier layer. In some embodiments, substantially all the chalcogen and of the transition metal exist as a chalcogenide in the barrier layer.

General Process

In some embodiments, the transition metal precursor and the reactive chalcogen species are provided in the reaction chamber alternatively and sequentially to form a transition metal chalcogenide barrier layer. In the current disclosure, atomic layer deposition (ALD) may be used to deposit a barrier layer. As used herein, the term ALD may refer to vapor deposition process in which deposition cycles, in some embodiments a plurality of consecutive deposition cycles, are conducted in a reaction chamber. Typically, during each cycle the precursor is chemisorbed to a deposition surface (e.g. a substrate surface or a previously deposited underlying surface, such as material from a previous ALD cycle), forming a monolayer or sub-monolayer that does not readily react with any additional precursor. Thus, the chemisorption may be considered to be a self-limiting reaction. Thereafter, if necessary, a reactant (e.g., another precursor or reaction gas) may subsequently be introduced into the reaction chamber for use in converting the chemistry or precursor to the desired material on the deposition surface. Typically, this reactant is capable of further reaction with a precursor. Further, purging steps may also be utilized during each cycle to remove excess precursor and/or reactant from the reaction chamber and/or remove excess reactant, precursor and/or their reaction byproducts from the reaction chamber.

The term purge may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactive species. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a chalcogen precursor to the reactor chamber, wherein the substrate on which a layer is deposited does not move. For example in the case of spatial purges, a purge step can take the following form: moving a substrate from a first location to which a transition metal precursor is continuously supplied, through a purge gas curtain, to a second location to which a chalcogen precursor is continuously supplied. Purging times may be, for example, from about 0.05 seconds to about 60 seconds, from about 0.5 s to about 60 s, or from about 1 s to about 60 s, or from about 5 s to about 60 s, or from about 10 s to about 60 s, or from about 20 s to about 60 s. In some embodiments, purging time is from about 0.5 s to about 45 s, or from about 1 s to about 30 s, or from about 5 s to about 25 s. In some embodiments, a purge time is 15 s, 30 s or 50 s. However, other purge times can be utilized if necessary, such as where highly conformal step coverage over extremely high aspect ratio structures or other structures with complex surface morphology is needed, or in specific reactor types, such as a batch reactor, may be used. In some embodiments, the reaction chamber is purged between providing the transition metal precursor and providing the reactive chalcogen species in the reaction chamber.

In some embodiments, a deposition process for a barrier layer has one or more phases which are not self-limiting. For example, in some embodiments at least one of the precursors and/or reactants may be at least partially decomposed on the substrate surface. Thus, in some embodiments the process may operate in a process condition regime close to CVD conditions or in some cases fully in CVD conditions.

Chemical vapor deposition (CVD) processes typically involve gas-phase reactions between two or more precursors or reactants. The reactants can be provided simultaneously to a reaction chamber or substrate, or in partially or completely separated pulses. The substrate and/or reaction chamber can be heated to promote the reaction between the gaseous reactants. In some embodiments the reactants are provided until a thin film having a desired thickness is deposited. In some embodiments, CVD may be performed in a cyclic mode. Cyclic CVD processes can be used with multiple cycles to deposit a thin film having a desired thickness. In cyclic CVD-type processes, the reactants may be provided to the reaction chamber in pulses that do not overlap, or that partially or completely overlap.

In the methods according to the current disclosure, plasma is used to generate reactive chalcogen species. Thus, in some embodiments, the reactive chalcogen species is generated by plasma. The methods according to the current disclosure may be termed plasma-enhanced deposition methods, for example PEALD or PECVD. The reactive chalcogen species can be generated by radiofrequency (RF) plasma. The reactive chalcogen species can be generated by, for example, inductively coupled plasma (ICP), capacitively coupled plasma (CCP), or microwave plasma. Reactive chalcogen species according to the current disclosure may comprise ions, radicals or both.

In some embodiments, the reactive chalcogen species are generated from a hydrogen-containing plasma. In some embodiments, the reactive chalcogen species are generated from a nitrogen-containing plasma. In such embodiments, nitrogen may be incorporated into the transition metal chalcogenide material. In some embodiments, the reactive chalcogen species are generated from a noble gas-containing plasma. In some embodiments, the reactive chalcogen species are generated from argon-containing plasma. In some embodiments, the reactive chalcogen species are generated from helium-containing plasma. In some embodiments, the reactive chalcogen species are generated from krypton-containing plasma. In some embodiments, the reactive chalcogen species are generated from xenon-containing plasma. In some embodiments, the reactive chalcogen species are generated from neon-containing plasma. In some embodiments, the reactive chalcogen species are generated from plasma containing hydrogen and nitrogen. In some embodiments, the reactive chalcogen species are generated from plasma containing argon and nitrogen. In some embodiments, the reactive chalcogen species are generated from plasma containing helium and nitrogen. In some embodiments, the reactive chalcogen species are generated from plasma containing a noble gas and hydrogen. In some embodiments, the reactive chalcogen species are generated from plasma containing argon and hydrogen. In some embodiments, the reactive chalcogen species are generated from plasma containing helium and hydrogen. In some embodiments, the reactive chalcogen species are generated from plasma containing krypton and hydrogen. In some embodiments, the reactive chalcogen species are generated from plasma containing xenon and hydrogen.

In some embodiments, plasma is generated from a gas containing substantially only hydrogen. In some embodiments, plasma is generated from a gas containing substantially only a noble gas. In some embodiments, plasma is generated from a gas containing substantially only argon. In some embodiments, plasma is generated from a gas containing substantially only helium.

In some embodiments, the method comprises using at least two different plasmas. In some embodiments, plasma is generated from a gas containing substantially only a noble gas and hydrogen. In some embodiments, plasma is generated from a gas containing substantially only argon and hydrogen. However, in some embodiments, plasma may be generated from a gas containing three elements or compounds. In some embodiments, plasma may be generated from a gas containing four elements or compounds.

Plasma power of RF-generated can be varied in different embodiments of the current disclosure. In some embodiments, plasma is generated by applying RF power of from about 10 W to about 1,000 W, or from about 50 W to about 1,000 W, or from about 100 W to about 500 W. In some embodiments the RF power density may be from about 0.02 $W/cm^2$ to about 2.0 $W/cm^2$, or from about 0.05 $W/cm^2$ to about 1.5 $W/cm^2$. The RF power may be applied to a gas that flows during the plasma pulse time, that flows continuously through the reaction chamber, and/or that flows through a remote plasma generator. Thus, in some embodiments, reactive chalcogen species may be formed remotely via plasma discharge ("remote plasma") away from the substrate or reaction space. In some embodiments, reactive chalcogen species may be formed in the vicinity of the substrate or directly above substrate ("direct plasma").

Generally, using plasma-enhanced processes, such as PEALD or PECVD, it is possible to use lower reaction temperatures, thus decreasing the thermal budget of the manufacturing process. This may be especially important in back-end of line (BEOL) processes, such as in the fabrication of interconnects. In some embodiments, the temperature of the reaction chamber during providing the transition metal precursor and the reactive chalcogen species in the reaction chamber is from about 30° C. to about 500° C., or from about 50° C. to about 500° C. For example, the temperature may be from about 50° C. to about 400° C., or from about 50° C. to about 300° C., or from about 50° C. to about 200° C. In some embodiments, the temperature is from about 100° C. to about 450° C., or from about 100° C. to about 400° C., or from about 100° C. to about 300° C. In some embodiments, the temperature is from about 200° C. to about 450° C., or from about 250° C. to about 450° C., such as 350° C. In some embodiments, the temperature is from about 300° C. to about 500° C., or from about 400° C. to about 500° C. In some embodiments, a barrier layer according to the current disclosure may be deposited at ambient temperature. In some embodiments, ambient temperature is room temperature (RT). In some embodiments, ambient temperature may vary between 20° C. and 30° C.

Substrate

The method according to the current disclosure comprises providing a transition metal precursor and a reactive chalcogen species in a reaction chamber holding a substrate therein.

As used herein, the term substrate may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

In the methods according to the current disclosure, a substrate comprises an opening. Thus, the substrate comprises a groove or a trench into which a metal line is to be formed. The metal line may have various shapes, depending on how the semiconductor device in question has been designed. The depth of the opening may vary. The width of the opening may vary. For example, the width of the opening may be 40 nm or less. In some embodiments, the width of the opening is 30 nm or less. In some embodiments, the width of the opening is 25 nm or less. In some embodiments, the width of the opening is 20 nm or less, 12 nm or less, or 8 nm or less. For example, and opening may have a width from about 6 nm to about 12 nm, or from about 8 nm to about 12 nm.

Currently, a barrier layer is deposited to a pre-existing opening in a substrate. However, a reverse scheme may be possible, as etching methods are developed further. In such processes, a metal is deposited on a substrate, and the lines are formed by etching metal material. Then, a barrier layer is deposited on the metal, and the space between the barrier-layer covered metal lines is filled with semiconductor material, to form metal lines separated by dielectric material. It may is possible to at least partially replace the dielectric material between the metal lines by air gaps. Such methods of forming metal lines may be especially relevant in future as the distances between components in a semiconductor device become smaller.

The method of depositing a barrier layer according to the current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously. In some embodiments, the reaction chamber may comprise several substrate processing stations.

Transition Metal

The barrier layer deposited according to the current disclosure comprises a transition metal chalcogenide. In some embodiments, the barrier layer according to the current disclosure consist essentially of, or consist of, a transition metal chalcogenide. In some embodiments, a transition metal is a group 4 to 6 transition metal. Thus, the metal of the transition metal precursor is a group 4 to group 6 transition metal. In some embodiments, the metal of the transition metal precursor is a group 4 transition metal. In some embodiments, the metal of the transition metal precursor is a group 5 transition metal. In some embodiments, the metal of the transition metal precursor is a group 6 transition metal.

In some embodiments, the metal of the transition metal precursor is selected from a group consisting of molybdenum (Mo), tungsten (W), tantalum (Ta), niobium (Nb) and titanium (Ti), zirconium (Zr), hafnium (Hf) and rhenium (Re). In some embodiments, a transition metal is titanium. In some embodiments, a transition metal is zirconium. In some embodiments, a transition metal is hafnium. In some embodiments, a transition metal is vanadium. In some embodiments, a transition metal is niobium. In some embodiments, a transition metal is tantalum. In some embodiments, a transition metal is chromium. In some embodiments, a transition metal is molybdenum. In some embodiments, a transition metal is tungsten.

In some embodiments of the disclosure, a transition metal precursor is provided into the reaction chamber for a time period of between about 0.01 s and about 60 s, between about 0.05 s and about 10 s, between about 0.1 s and about 5.0 s, between about 0.5 s and about 10 s, between about 1 s and about 30 s. For example, the transition metal precursor may be provided in the reaction chamber for about 0.5 s, for about 1 second, for about 2 s, for about 3 s, for about 5 s. In addition, during the pulsing of the transition metal precursors, the flow rate of the transition metal precursor may be less than 2000 sccm, or less than 500 sccm, or even less than 100 sccm. In addition, during providing the transition metal precursor over the substrate the flow rate of the transition metal precursor may range from about 1 to 2000 sccm, from about 5 to 1000 sccm, or from about 10 to about 500 sccm.

Excess transition metal precursor and reaction byproducts (if any) may be removed from the surface, e.g., by pumping or purging with an inert gas. For example, in some embodiments of the disclosure, the methods may comprise a purge cycle wherein the substrate surface is purged for a time period of less than approximately 2.0 seconds. Excess transition metal precursor and any reaction byproducts may be removed with the aid of a vacuum, generated by a pumping system, in fluid communication with the reaction chamber. An inert gas, such as argon may be used in purging.

In some embodiments, the method further comprises providing a second transition metal precursor in the reaction chamber. Thus, the barrier layer according to the current disclosure may comprise two different transition metals. In such embodiments, the two transition metal precursors would contain the same transition metal and different ligands. Alternatively, the two transition metal precursors may contain different transition metals. Such embodiments may be useful in tuning the barrier layer properties in different applications. The two transition metal precursors may be provided to the reaction chamber at least partially at the same time. Alternatively, the two transition metal precursors may be provided in the reaction chamber separately. The two transition metal precursors may be provided to the reaction chamber one after the other in any order. However, the two transition metal precursors may be separated by a purge step and/or by providing reactive chalcogen species into the reaction chamber.

Metal organic and organometallic precursors may be used in various vapor deposition applications. Using variable organic ligands to the metal may help in fine-tuning precursor properties, such as volatility, stability and reactivity, to the given application. In organometallic precursors, the metal is attached to at least one carbon atom of an organic ligand. In metal organic precursors, the metal is not attached to a carbon atom of the ligand, but to a different atom, such as nitrogen or oxygen. In some embodiments, transition metal precursor comprises a metal organic compound or an organometallic compound. In some embodiments, the transition metal precursor comprises a metal organic compound. In some embodiments, the metal organic compound comprises nitrogen. In some embodiments, the metal organic compound comprises at least one of an amido group and an imido group. In some embodiments, the metal organic compound comprises at least one of a tert-butylimido group and a dimethylamido group. In some embodiments, the transition metal atom is attached to a nitrogen in the transition metal precursor. In some embodiments, the transition metal atom is attached to an imido nitrogen in the transition metal precursor.

In some embodiments, a transition metal is molybdenum and the transition metal precursor comprises bis(tert-butylimido)bis(dimethylamido)molybdenum $(Mo(NMe_2)_2 (N^tBu)_2)$. In some embodiments, a transition metal precursor consist essentially of, or consists of bis(tert-butylimido)bis (dimethylamido)molybdenum.

In some embodiments, a transition metal is tungsten and the transition metal precursor comprises bis(tert-butylimido) bis(dimethylamido)tungsten $(W(NMe_2)_2(N^tBu)_2)$. In some embodiments, a transition metal precursor consists essentially of, or consist of bis(tert-butylimido)bis(dimethylamido)tungsten.

In some embodiments, a transition metal is tantalum and the transition metal precursor comprises bis(tert-butylimido) tris(dimethylamido)tantalum $(Ta(NMe_2)_3(N^tBu)_2)$. In some embodiments, a transition metal precursor consists essentially of, or consist of bis(tert-butylimido)tris(dimethylamido)tantalum. In some embodiments, a transition metal precursor comprises penta(dimethylamino)tantalum $(Ta (NMe_2)_5)$.

In some embodiments, a transition metal is niobium and the transition metal precursor comprises bis(tert-butylimido) tris(diethylamido)niobium $Nb(NEt_2)_3(N^tBu)_2$. In some embodiments, a transition metal precursor consists essentially of, or consist of bis(tert-butylimido)tris(diethylamido) niobium. In some embodiments, a transition metal is niobium and the transition metal precursor comprises (tert-butylimido)tris(diethylamino)niobium $Nb(NEt_2)_3(N^tBu)$. In some embodiments, a transition metal precursor consists essentially of, or consist of (tert-butylimido)tris(diethylamino)niobium.

In some embodiments, a transition metal is titanium and the transition metal precursor comprises tert(dimethylamido)titanium $Ti(NMe_2)_4$. In some embodiments, a transition metal precursor consists essentially of, or consist of tert (dimethylamido)titanium.

In some embodiments, a transition metal precursor comprises, consists essentially of, or consist of a transition metal halide or an oxyhalide. Exemplary transition metal halides are $MoCl_4$, $MoCl_5$, $MoF_6$, $TiCl_4$, $ZrCl_4$, $ZrI_4$, $HfCl_4$, $HfI_4$, $VCl_4$, $NbCl_5$, $NbF_5$, $TaCl_5$, $TaF_5$, $TaI_5$, $WCl_5$, $WCl_6$, $WF_6$. In addition to chlorides, also fluorides, bromides and iodides are possible. Also, transition metals may exist in different oxidation states in halides. In some embodiments, an oxyhalide, such as $VOCl_3$ may be used.

Chalcogen

Most commonly used chalcogenide is sulfide. However, other chalcogenides, such as selenides and tellurides, are explored for their potential in various microelectronic applications. Thus, transition metal chalcogenide barrier layer deposited by methods disclosed herein may comprise one or more transition metals, such as Mo, W and/or Nb, and additionally one or more chalcogens. Chalcogens are considered to be the elements of Group 16 of the periodic table of elements, except oxygen. In some embodiments, the chalcogen is selected from a group consisting of sulfur (S), selenium (Se) and tellurium (Te). TMC according to the current disclosure may comprise, for example, Mo and S, Mo and Se or Mo and Te. In some embodiments, the TMC barrier layer according to the current disclosure may comprise W and S, W and Se or W and Te. In some embodiments, the transition metal-comprising material according to the current disclosure may comprise Nb and S, Nb and Se or Nb and Te. TMC barrier layer according to the current disclosure may comprise, for example, Ta and S, Ta and Se or Ta and Te. The transition metal-comprising material according to the current disclosure may comprise, for example, Ti and S, Ti and Se or Ti and Te.

In some embodiments, reactive chalcogen species is derived from a chalcogen precursor. A chalcogen precursor may refer to a precursor compound comprising a chalcogen, wherein a chalcogen is an element from Group 16 of the periodic table of elements, including sulfur, selenium, and tellurium. Various chalcogen precursors may be used in a method according to the current disclosure to form reactive chalcogen species. In some embodiments, the chalcogen precursor comprises a chalcogen hydride. In some embodiments, a chalcogen precursor is selected from the following list: $H_2S$, $H_2Se$, $H_2Te$, $(CH_3)_2S$, $(NH_4)_2S$, dimethylsulfoxide $((CH_3)_2SO)$, $(CH_3)_2Se$, $(CH_3)_2Te$, elemental or atomic S, Se, Te, other precursors comprising chalcogen-hydrogen bonds, such as $H_2S_2$, $H_2Se_2$, $H_2Te_2$, or chalcogenols with the formula R—Y—H, wherein R can be a substituted or unsubstituted hydrocarbon, for example a C1-C8 alkyl or substituted alkyl, such as an alkylsilyl group, for example a linear or branched C1-C5 alkyl group, and Y can be S, Se, or Te. In some embodiments, a chalcogen precursor comprises a thiol with the formula R—S—H, wherein R can be substituted or unsubstituted hydrocarbon, for example C1-C8 alkyl group, more linear or branched, for example C1-C5 alkyl group. In some embodiments, a chalcogen precursor comprises a selenol with the formula R—Se—H, wherein R can be substituted or unsubstituted hydrocarbon, for example C1-C8 alkyl group, more linear or branched, for example C1-C5 alkyl group.

In some embodiments a chalcogen precursor may comprise a compound having the formula (II):

$$(R_3Si)_2Y \qquad \text{(II)}$$

wherein $R_3Si$ is an alkylsilyl group and Y can be S, Se or Te.

In some embodiments, a chalcogen precursor comprises S or Se. In some embodiments, a chalcogen precursor comprises S. In some embodiments, a chalcogen precursor does not comprise S. In some embodiments the chalcogen precursor may comprise an elemental chalcogen, such as elemental sulfur. In some embodiments, a chalcogen precursor comprises Te. In some embodiments, a chalcogen precursor does not comprise Te. In some embodiments, a chalcogen precursor comprises Se. In some embodiments, a chalcogen precursor does not comprise Se. In some embodiments, a chalcogen precursor is selected from precursors comprising S, Se or Te. In some embodiments, a chalcogen precursor comprises a compound having the formula (III):

$$H_2S_n, \qquad \text{(III)}$$

wherein n is from 4 to 10.

In some embodiments, suitable chalcogen precursors may include any number of chalcogen-comprising compounds. In some embodiments, a chalcogen precursor may comprise at least one chalcogen-hydrogen bond. In some embodiments the chalcogen precursor may comprise a chalcogen plasma, chalcogen atoms or chalcogen radicals. A plasma may be generated in the reaction chamber or upstream of the reaction chamber to form reactive chalcogen species. In some embodiments the chalcogen precursor may comprise a chalcogen plasma, chalcogen atoms or chalcogen radicals formed from a chalcogen precursor comprising a chalcogen-hydrogen bond, such as $H_2S$.

In some embodiments, the purity of the chalcogen precursor may influence the composition of the deposited TMC and therefore high purity sources of the chalcogen precursor may be utilized. In some embodiments, the chalcogen precursor may have a purity of greater than or equal to 95.0%, or a purity of greater than or equal to 98.0%, or a purity of greater than or equal to 99.0%, or a purity of greater than or equal to 99.5%. As a non-limiting example, the chalcogen precursor may comprise hydrogen sulfide ($H_2S$) with a purity of greater than or equal to 99.0% or of greater than or equal to 99.5%.

In some embodiments, providing a chalcogen precursor in the reaction chamber (i.e. exposing the substrate to the chalcogen precursor) may comprise, pulsing the reactive chalcogen species (e.g., hydrogen sulfide plasma) over the substrate for a time period of from about 0.01 seconds to about 60 seconds, or from about 0.01 seconds to about 30 seconds, or from about 0.01 seconds to about 10 seconds. In some embodiments, a reactive chalcogen species may be provided in the reaction chamber from about 5 seconds to about 30 seconds, or from about 10 seconds to about 30 seconds. In some embodiments, a reactive chalcogen species may be provided in the reaction chamber for less than about 40 seconds, or less than about 30 seconds, or less than about 20 seconds, or less than about 10 seconds, or less than about 5 seconds. During providing a reactive chalcogen species in the reaction chamber, a flow rate of a reactive chalcogen species may be less than about 100 sccm, or less than about 50 sccm, or less than about 25 sccm, or less than about 10 sccm, or less than about 4 sccm. For example, a flow rate of a reactive chalcogen species may be between about 1 sccm and about 50 sccm, such as about 2 sccm, about 25 sccm or about 40 sccm. In addition, during providing a reactive chalcogen species over the substrate the flow rate of the reactive chalcogen species may be from about 1 sccm to about 2000 sccm, or from about 5 sccm to about 1000 sccm, or from about 10 sccm to about 500 sccm. In some embodiments, a chalcogen precursor is mixed with argon and/or hydrogen.

The reactive chalcogen species may react with transition metal-comprising molecules on the substrate. In some embodiments, the reactive chalcogen species may comprise hydrogen sulfide and the reaction may deposit a transition metal sulfide, such as molybdenum sulfide on the substrate.

In some embodiments, a barrier layer according to the current disclosure comprises amorphous TMC. In some embodiments, a barrier layer may comprise both amorphous and crystalline TMC material. In some embodiments, a barrier layer according to the current disclosure comprises transition metal and chalcogenide elements that at least in part do not form chalcogenide compounds. In some embodiments, TMC is amorphous or predominantly amorphous after deposition. In some embodiments, methods according to the current disclosure comprise a heating step to crystallize the amorphous TMC. For example, transition metal trichalcogenides may be deposited in amorphous form. In some embodiments, morphology of a deposited TMC can be changed from amorphous to layered horizontal layers by appropriately regulating plasma composition, temperature or by using a three-reactant (ABC-type) process during deposition. Further, layered horizontal layers may be changed to films with out-of-plane oriented layers by changing the plasma composition, temperature, or by using an ABC-type process during deposition. Plasma composition may be regulated by, for example, changing Ar:$H_2$:$H_2$S ratio in plasma. An ABC-type process may comprise alternatively and sequentially providing a transition metal precursor into a reaction chamber (A), providing reactive chalcogen species into the reaction chamber (B) and providing hydrogen and/or noble gas plasma into the reaction chamber (C). In some embodiments, applying substrate bias may affect the morphology of the deposited material. Biasing may be used to increase ion energy up to, for example, 300 eV.

The composition and morphology of the deposited TMC barrier layer material may be tuned by modification of plasma parameters.

An alternative route to produce a barrier layer according to a method of the current disclosure is to first deposit a transition metal oxide using an oxygen precursor with a transition metal precursor. The transition metal oxide may be converted to a chalcogenide using a reactive chalcogen species according to the current disclosure. In some embodiments, a transition metal nitride is first deposited, and it is then converted to a sulfide.

In an aspect, a method of depositing a transition metal chalcogenide barrier layer is disclosed, the method comprising providing a substrate having an opening into a reaction chamber, providing a transition metal precursor in the reaction chamber in vapor phase, providing an oxygen precursor in the reaction chamber, and providing an reactive chalcogen species in the reaction chamber. In some embodiments, the oxygen precursor comprises oxygen plasma or water. In some embodiments, the oxygen precursor is oxygen plasma. In some embodiments, the oxygen precursor is water. In some embodiments, the oxygen precursor is ozone. In some embodiments, the chalcogen is sulfur.

The method according to the current disclosure, especially in embodiments utilizing a transition metal oxide intermediate, may be performed in a single reaction chamber, or in two or more reaction chambers. For example, the metal oxide intermediate may be deposited in a first reaction chamber, and the conversion to a chalcogenide may be performed in a second reaction chamber.

Alternative Layer Structures

In some embodiments, the method further comprises the deposition of a second barrier layer material. In such embodiments, two different TMC's may be deposited to form a barrier layer according to the current disclosure. Alternatively, the barrier layer may be formed of one TMC and one or more other materials.

There are various ways in which the two or more barrier layer materials may be deposited. For example, there may be distinct layers of two or more barrier layer materials. In some embodiments, one or more of the layers may comprise a TMC. In some embodiments, one or more of the layers may consist essentially of, or consist of a TMC. For example, one of the barrier layer materials may be $MoS_2$, and the second one a chalcogenide of a different metal. The second chalcogenide may be a disulfide. The different morphology and/or grain structure may enhance the barrier properties of the barrier layer. In some embodiments, a TMC may be combined with a barrier material of another type. For example, a transition metal chalcogenide deposited according to the current disclosure may be combined tantalum nitride. In some embodiments, a barrier layer according to the current disclosure comprises, consists essentially of or consists of tantalum nitride and tantalum sulfide.

In some embodiments, a barrier layer comprising predominantly of a TMC deposited according to the current disclosure may be doped. Doping may be effected in a cyclic vapor deposition process, such as PEALD or cyclic PECVD by an intermediate cycle in which one or both precursors differ from the ones used in the main process. The level of doping may be adjusted by altering the frequency of the dopant deposition cycle. For example, a barrier layer may be doped with niobium. In some embodiments, a barrier layer is doped with nitrogen. In some embodiments, a barrier layer is doped with aluminum. In some embodiments, a barrier layer is doped with manganese. In some embodiments, a barrier layer is doped with titanium.

In some embodiments, the TMC deposited according to the current method is a multicomponent material comprising, for example two different metals and a chalcogenide. Such material may be deposited, for example through an ABC-type a process, in which two transition metal precursors and a reactive chalcogen species are alternated in a loop. In some embodiments, a first transition metal precursor may be alternated with reactive chalcogen species for a predetermined number of cycles, and then a second transition metal precursor is alternated with the same or a different reactive chalcogen species. For example, molybdenum and tungsten precursors may be alternated with a sulfur precursor to obtain $MoW_xS_y$ material, or molybdenum and niobium precursors may be alternated with a sulfur precursor to obtain $MoNb_xS_y$ material, or tungsten and niobium precursors may be alternated with a sulfur precursor to obtain $WNb_xS_y$ material.

In another aspect, an interconnect structure is disclosed, wherein the interconnect structure comprises conductive interconnect material comprising an outer surface, dielectric material facing the outer surface of interconnect material, and a barrier layer disposed between the surface and the dielectric material, wherein the barrier layer comprises essentially of a transition metal chalcogenide deposited using a metal organic transition metal precursor and an reactive chalcogen species, and wherein the barrier layer has a thickness of 3 nm or less. In some embodiments, the interconnect material is selected from a group consisting of tungsten (W), copper (Cu), cobalt (Co), ruthenium (Ru), aluminum (Al), gold (Au), silver (Ag) or a combination thereof. In some embodiments, the interconnect material comprises copper. In some embodiments, the interconnect material is copper.

The disclosure is further explained by the following exemplary embodiments depicted in the drawings. The illustrations presented herein are not meant to be actual views of any particular material, structure, or device, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1 illustrates an exemplary embodiment of an interconnect 100 containing a barrier layer 120 according to the current disclosure. The interconnect is displayed as a cross section indicating interconnect material 110, a barrier layer 120 enclosing the interconnect material 110, and the dielectric material 130 surrounding the interconnect. The barrier layer 120 is disposed between the dielectric 130 and the interconnect material 110, preventing diffusion of interconnect material 110 into the dielectric 130. The interconnect material 110 may be a conductive metal, such as copper, or an alloy of metals. The cross section of FIG. 1 indicates clearly that with a limited space allocated for the interconnect, the barrier layer should be as thin as possible to maximize the volume available for signal propagation.

The interconnect 100 is formed in an opening in the dielectric 130. The opening is formed according to the integrated circuit design, and the shape of its cross-sectional profile, as well as other dimensions depend on the design in question. The barrier layer material 120 is first deposited in the opening, after which the interconnect material 110 is deposited into the remaining volume. Various additional processing steps may be needed for the fabrication of an interconnect. The finalized interconnect structure may contain capping layers and other components (not shown).

Figure 2:
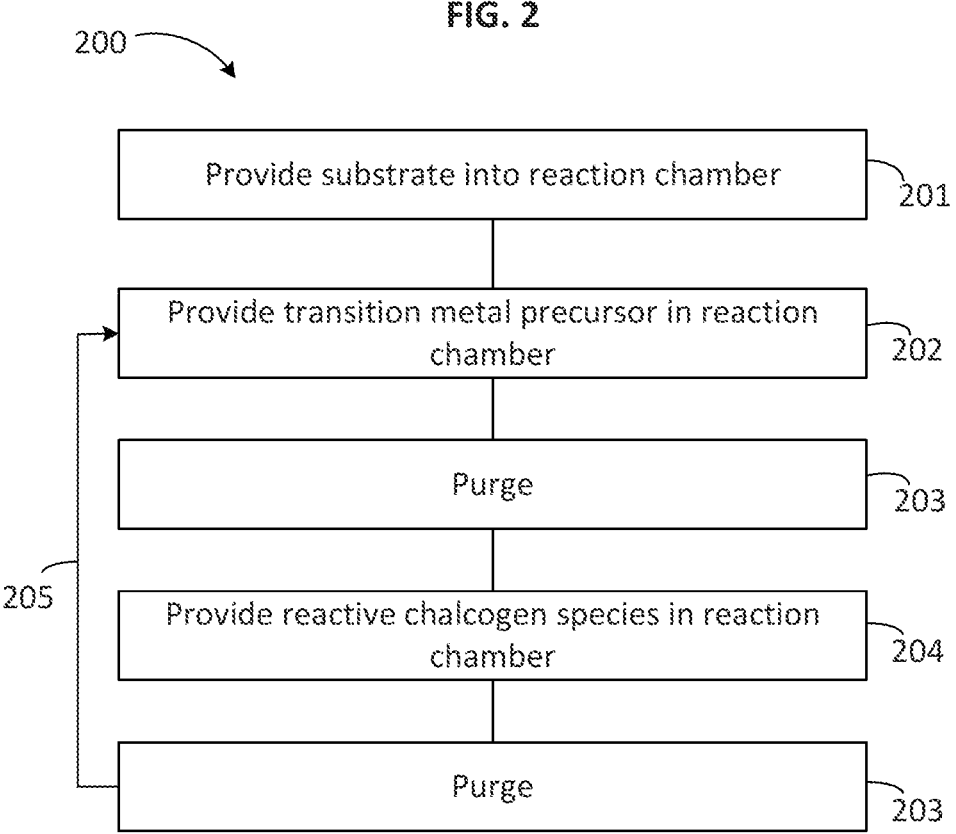
FIG. 2 depicts an exemplary embodiment of a method according to the current disclosure.

FIG. 2 depicts an exemplary embodiment of a method 200 according to the current disclosure. In the first phase of the method 201, a substrate is provided into a reaction chamber. A transition metal precursor is provided in the reaction chamber at phase 202. A reactive chalcogenide species is provided into the reaction chamber at phase 203. For clarity, in a cyclic vapor deposition process, such as an ALD or a cyclic CVD process, either phase 203 or phase 202 may follow phase 201. A deposition cycle (i.e. the combination of phases 202 and 203, including optional purge phases 203) is repeated for a number of times (loop 205 in FIG. 2), such that the substrate is contacted by the two precursors several times. A deposition cycle is repeated (loop 205) until a desired layer thickness is achieved. A deposition cycle may be performed from 1 to about 200 times, for example from 2 to about 200 times, or from about 5 to 200 times. In some embodiments, a deposition cycle is performed from 1 to about 100 times, or from 1 to about 100 times, or from 1 to about 20 times. For example, a deposition cycle may be performed about 5, 30 or 50 times.

When a transition metal precursor is provided in the reaction chamber, it may chemisorb to the substrate surface. When a reactive chalcogen species is provided into the reaction chamber, it may make contact with the transition metal precursor, or derivates thereof chemisorbed on the substrate surface, to form the barrier layer material.

FIG. 2 depicts purge phases 203 after each of phases 202 and 203. Purge is employed in many embodiments, but it has been omitted from the following figures for simplicity.

Figure 3:
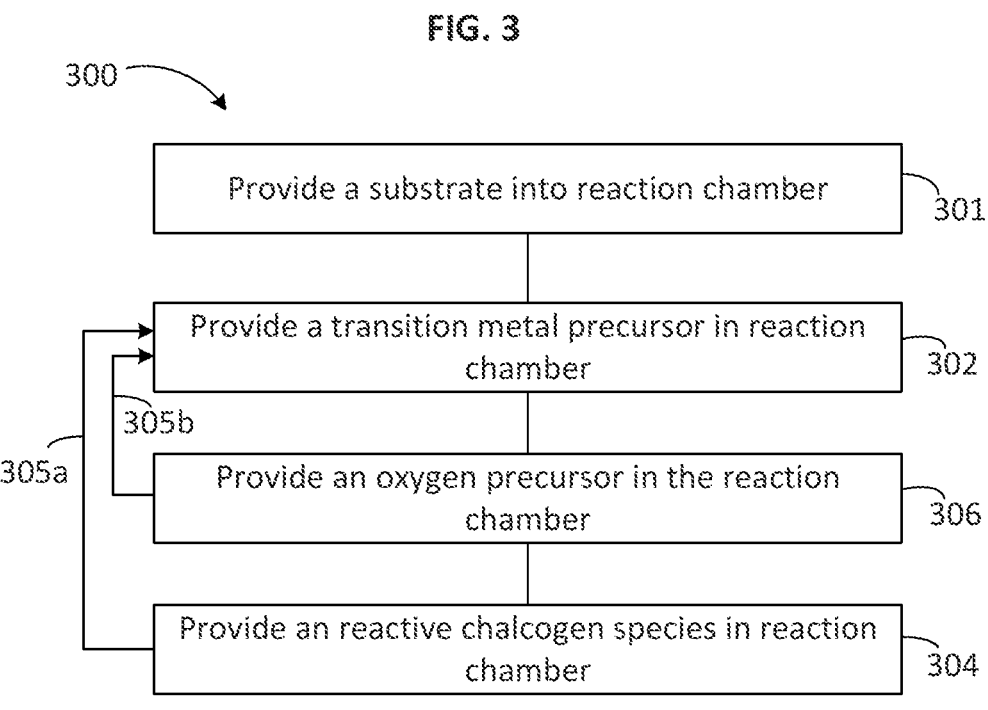
FIG. 3 depicts an exemplary embodiment of a method according to the current disclosure in which the barrier layer is deposited through depositing an intermediate transition metal oxide layer.

FIG. 3 depicts an exemplary embodiment of a method according to the current disclosure in which the barrier layer is deposited through depositing an intermediate transition metal oxide layer. In phase 301, the substrate is provided into the reaction chamber. A transition metal precursor is provided in the reaction chamber at phase 302. Then, an oxygen precursor, such as oxygen plasma, ozone or water, is provided in the reaction chamber at phase 306. This results in the formation of transition metal oxide on the substrate. In some embodiments, the process may be continued immediately by providing a reactive chalcogen species in the reaction chamber at phase 304. In some embodiments, the substrate comprising the transition metal oxide may be transferred to another reaction chamber for converting the metal oxide into a transition metal chalcogenide.

Analogously to the embodiment of FIG. 2, the deposition cycle may be repeated one or more times. In the embodiment of FIG. 3, the deposition of a transition metal oxide and subsequent conversion to a TMC can be cycled according to loop 305a. Alternatively, in some embodiments, the transition metal oxide subcycle 305b may be repeated, and the chalcogenide conversion phase 304 is performed at the end of the deposition process.

Figure 4:
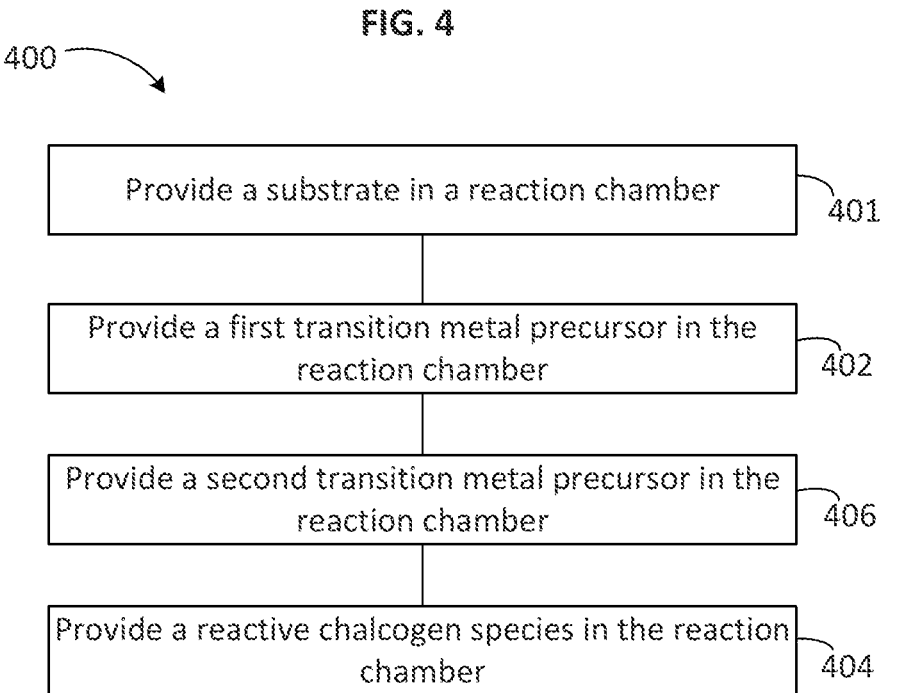
FIG. 4 depicts an exemplary embodiment of a method according to the current disclosure in which two different transition metal precursors are used.

FIG. 4 depicts an exemplary embodiment of a method according to the current disclosure in which two different transition metal precursors are used. In this embodiment, after providing a substrate into the reaction chamber 401, two transition metal precursors are provided in the reaction chamber sequentially at phases 402 and 406. There may be a purge phase between the two phases of providing transition metal precursors in the reaction chamber (not shown). The transition metal precursors may comprise a same transition metal, such as molybdenum, and different ligand(s) attached to the transition metal. In such embodiments, the resulting barrier layer would comprise one type of transition metal chalcogenide.

In some embodiments, the first and second transition metal precursors comprise different transition metals. The resulting barrier layer would comprise a mixture of two types of transition metal chalcogenides. For example, the first transition metal precursor may comprise molybdenum, while the second transition metal precursor may comprise titanium, or vanadium. In embodiments combining two different transition metals, the ligands of the first and second transition metal precursors may be the same or different.

FIG. 5 depicts another exemplary embodiment of a method according to the current disclosure in which two different transition metal precursors are used. As before, the method starts by providing a substrate in a reaction chamber 501. In the embodiment of FIG. 5, the method comprises two subcycles 505a and 505b, and each of the subcycles comprises providing a transition metal precursor 502, 507 and a reactive chalcogen species 504 in the reaction chamber. Similarly, as in FIG. 4, the transition metal precursors may comprise the same transition metal or different transition metals. In the embodiment of FIG. 5, the reactive chalcogen species is the same for both transition metal precursors, but embodiments can be envisaged in which each subcycle 505a, 505b would use different reactive chalcogen species. In embodiments comprising two reactive chalcogen species, the chalcogens could be, for example, S and Se. However, the two reactive chalcogen species could contain the same chalcogen but differ otherwise in their properties. For example, the chalcogen precursor may be the same, but different plasma parameters could be used in the two subcycles.

The overall amount of barrier layer material deposition may be regulated by the repetition of the supercycle 505c. The embodiment of FIG. 5 differs from that of FIG. 4 in that two barrier layer materials are deposited, one from each subcycle 505a, 505b. The ratio of the materials may be regulated by changing the relative number of repetitions of the two subcycles 505a and 505b within a supercycle 505c.

FIG. 6 depicts a further exemplary embodiment of a method according to the current disclosure as a part of an interconnect fabrication process. At phase 601, a substrate is provided in a reaction chamber. The substrate may have undergone various processing steps before phase 601. At phase 608, a barrier layer is deposited on the substrate by methods according to the current disclosure. Additional processing may be employed in the processing chamber before depositing the barrier layer on the substrate 608. After a barrier layer has been deposited, the chamber may be purged 603, and interconnect material is deposited at phase 609 into the opening comprising the barrier layer. The substrate may be moved to another reaction chamber before phase 609.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of depositing a transition metal chalcogenide barrier layer, the method comprising:

provide a substrate having an opening within a dielectric material, into a reaction chamber;

providing a transition metal precursor in the reaction chamber in vapor phase; and providing a reactive chalcogen species in the reaction chamber, to thereby deposit the transition metal chalcogenide barrier layer on the dielectric material and within the opening, wherein the transition metal chalcogenide barrier layer is between the dielectric material and a conductive metal, wherein the chalcogenide comprises one or more of S, Se, and Te, wherein the transition metal chalcogenide barrier layer mitigates diffusion between the conductive metal and the dielectric material, and wherein the transition metal precursor comprises a transition metal halide or a transition metal oxyhalide.

2. The method of claim 1, wherein the transition metal precursor comprises the transition metal oxyhalide.

3. The method of claim 1, wherein the transition metal precursor comprises $MoCl_4$, $MoCl_5$, $MoF_6$, $TiCl_4$, $ZrCl_4$, $ZrI_4$, $HfCl_4$, $HfI_4$, $VCl_4$, $NbCl_5$, $NbF_5$, $TaCl_5$, $TaF_5$, $TaI_5$, $WCl_5$, $WCl_6$, or $WF_6$.

4. The method of claim 1, wherein the method further comprises providing a second transition metal precursor in the reaction chamber.

5. The method of claim 4, wherein the second transition metal precursor comprises a metal organic compound comprising at least one of an amido group and an imido group.

6. The method of claim 5, wherein the metal organic compound comprises at least one of a tert-butylimido group and a dimethylamido group.

7. The method of claim 1, wherein the metal of the transition metal precursor is a group 4 to group 6 transition metal.

8. The method of claim 1, wherein the metal of the transition metal precursor is selected from a group consisting of molybdenum (Mo), tungsten (W), tantalum (Ta), niobium (Nb), titanium (Ti), zirconium (Zr), hafnium (Hf) and rhenium (Re).

9. The method of claim 1, wherein the reactive chalcogen species comprises $(NH_4)_2S$, $((CH_3)_2SO)$, $(CH_3)_2Se$, $(CH_3)_2Te$, elemental or atomic S, Se, Te, or chalcogenols with the formula R—Y—H, wherein R is a C1-C8 substituted or unsubstituted hydrocarbon, and Y is S, Se, or Te.

10. The method of claim 1, wherein the transition metal precursor and the reactive chalcogen species are provided in the reaction chamber alternatively and sequentially.

11. The method of claim 1, wherein the reactive chalcogen species is generated by plasma.

12. The method of claim 11, wherein the method comprises using at least two different plasmas.

13. The method of claim 1, wherein the temperature of the reaction chamber during providing the precursors in the reaction chamber is from about 50° C. to about 500° C.

14. The method of claim 1, wherein the transition metal chalcogenide barrier layer is substantially continuous and has a thickness of 3 nm or less.

15. The method of claim 1, further comprising applying substrate bias to affect a morphology of the transition metal chalcogenide barrier layer.

16. The method of claim 1, wherein the transition metal chalcogenide barrier layer is crystalline after deposition.

17. The method of claim 1, wherein the method further comprises the deposition of a second barrier layer material comprising a second metal chalcogenide, wherein a metal of the transition metal chalcogenide barrier layer and a metal of the second metal chalcogenide differ.

* * * * *